(12) United States Patent
Kim

(10) Patent No.: US 10,007,357 B2
(45) Date of Patent: Jun. 26, 2018

(54) METHOD FOR RECOGNIZING PRESS OF KEY ON KEYBOARD

(71) Applicant: TBR CO., LTD., Incheon (KR)

(72) Inventor: Yoon Chul Kim, Incheon (KR)

(73) Assignee: TBR CO., LTD., Incheon (KR)

( * ) Notice: Subject to any disclaimer, the term of this patent is extended or adjusted under 35 U.S.C. 154(b) by 0 days. days.

(21) Appl. No.: 15/550,082

(22) PCT Filed: May 23, 2016

(86) PCT No.: PCT/KR2016/005438
§ 371 (c)(1),
(2) Date: Aug. 10, 2017

(87) PCT Pub. No.: WO2017/030273
PCT Pub. Date: Feb. 23, 2017

(65) Prior Publication Data
US 2018/0046259 A1    Feb. 15, 2018

(30) Foreign Application Priority Data

Aug. 17, 2015  (KR) .......................... 10-2015-0115638

(51) Int. Cl.
| | |
|---|---|
| *H03K 17/94* | (2006.01) |
| *G06F 3/02* | (2006.01) |
| *H03M 1/10* | (2006.01) |
| *H01H 13/84* | (2006.01) |
| *H01H 13/705* | (2006.01) |

(52) U.S. Cl.
CPC .............. *G06F 3/02* (2013.01); *H01H 13/705* (2013.01); *H01H 13/84* (2013.01); *H03M 1/1071* (2013.01)

(58) Field of Classification Search
CPC ........ G06F 3/02; H01H 13/705; H01H 13/84; H03M 1/1071
USPC .............................................. 341/22; 345/168
See application file for complete search history.

(56) References Cited

U.S. PATENT DOCUMENTS 5,790,652 A * 8/1998 Gulley ................ H04M 1/2472
 379/110.01
2007/0296709 A1* 12/2007 GuangHai ............. G06F 3/0227
 345/173

(Continued)

FOREIGN PATENT DOCUMENTS

| JP | 2008-017488 A | 1/2008 |
|---|---|---|
| KR | 2003-0053381 A | 6/2003 |

(Continued)

*Primary Examiner* — Ojiako O Nwugo
(74) *Attorney, Agent, or Firm* — Im IP Law; C. Andrew Im

(57) ABSTRACT

A method for recognizing a press of a key by a small force on a slim portable keyboard for use with a smart phone, a tablet PC, a general PC, or a notebook computer. A special-key press processing unit processes a press of a plurality of special keys. A plurality of general-key press processing units process a press of a plurality of general keys. A set number of general keys are configured to be one block. The keyboard is slim and can be conveniently carried. The keyboard includes a plurality of special key resistances and a plurality of general key resistances, each of which is proportional to a pressure caused by a press, to recognize a press of a key even when the key is pressed by a small force.

8 Claims, 9 Drawing Sheets

(56) References Cited

U.S. PATENT DOCUMENTS

| | | | | |
|---|---|---|---|---|
| 2008/0007529 A1* | 1/2008 | Paun | ................ | H03K 17/9622 |
| | | | | 345/168 |
| 2008/0192003 A1* | 8/2008 | Kondo | ................ | G06F 3/0219 |
| | | | | 345/156 |
| 2011/0078476 A1* | 3/2011 | Han | ................ | G06F 1/32 |
| | | | | 713/320 |
| 2014/0289177 A1* | 9/2014 | Laroco, Jr. | ........ | G06F 17/30876 |
| | | | | 706/12 |
| 2016/0357381 A1* | 12/2016 | Coin-Perard | ......... | G06F 3/0485 |
| 2017/0010846 A1* | 1/2017 | Bernstein | ................ | G06F 1/165 |
| 2017/0046060 A1* | 2/2017 | Karunamuni | ......... | G06F 3/0488 |

FOREIGN PATENT DOCUMENTS

| | | |
|---|---|---|
| KR | 10-2009-0118157 A | 11/2009 |
| KR | 10-2011-0043198 A | 4/2011 |
| KR | 10-1113248 B1 | 2/2012 |
| KR | 10-1391670 B1 | 5/2014 |

* cited by examiner

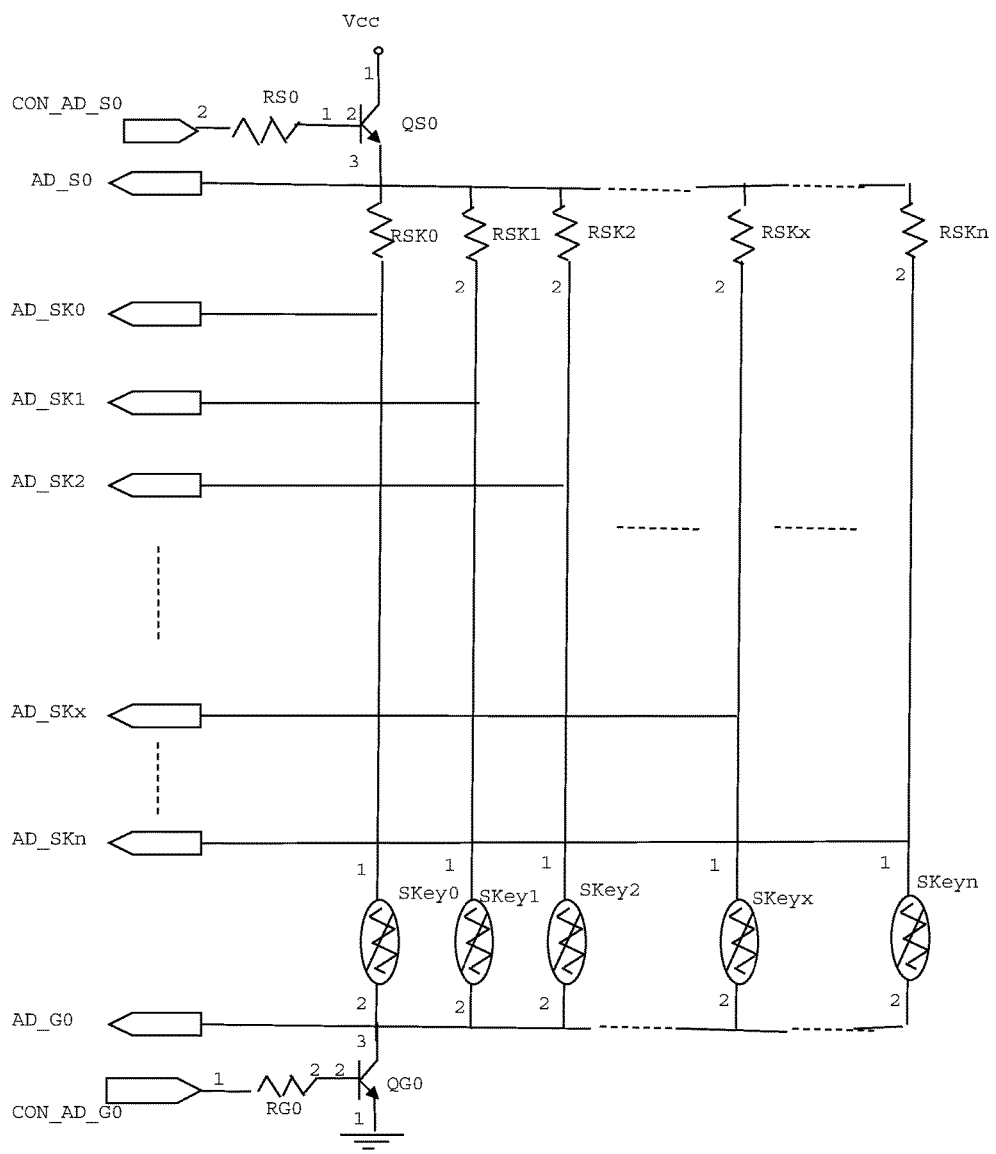
(FIG.1)

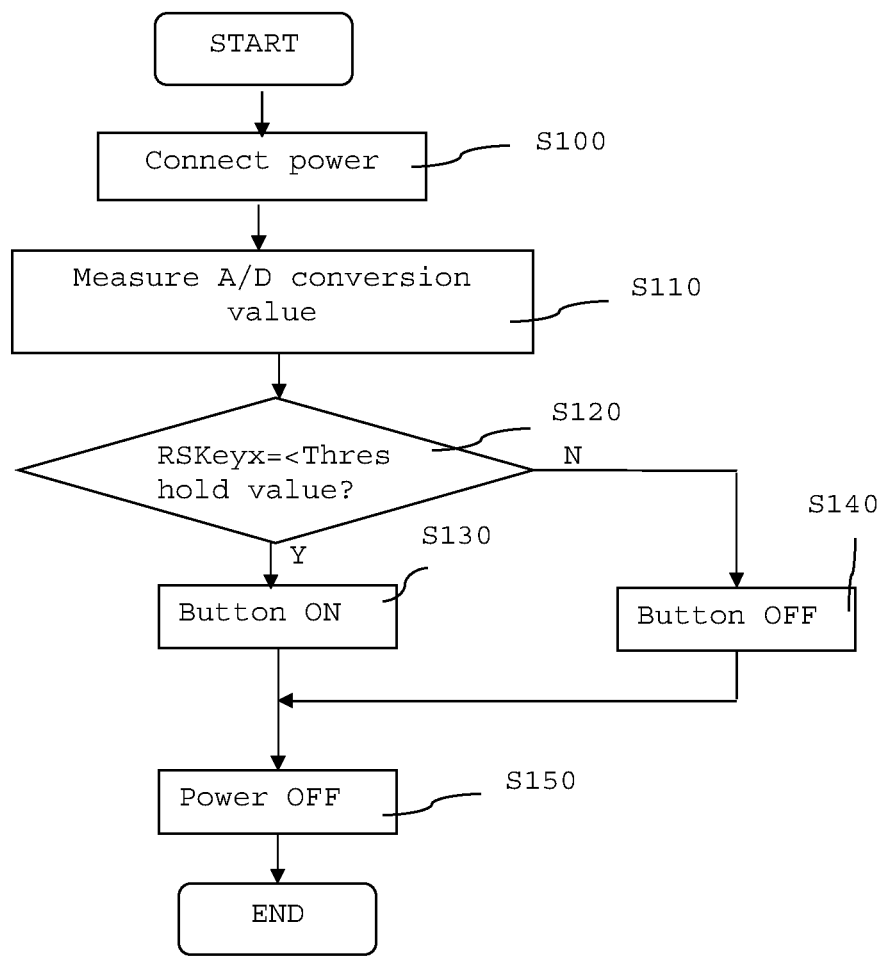
(FIG.2)

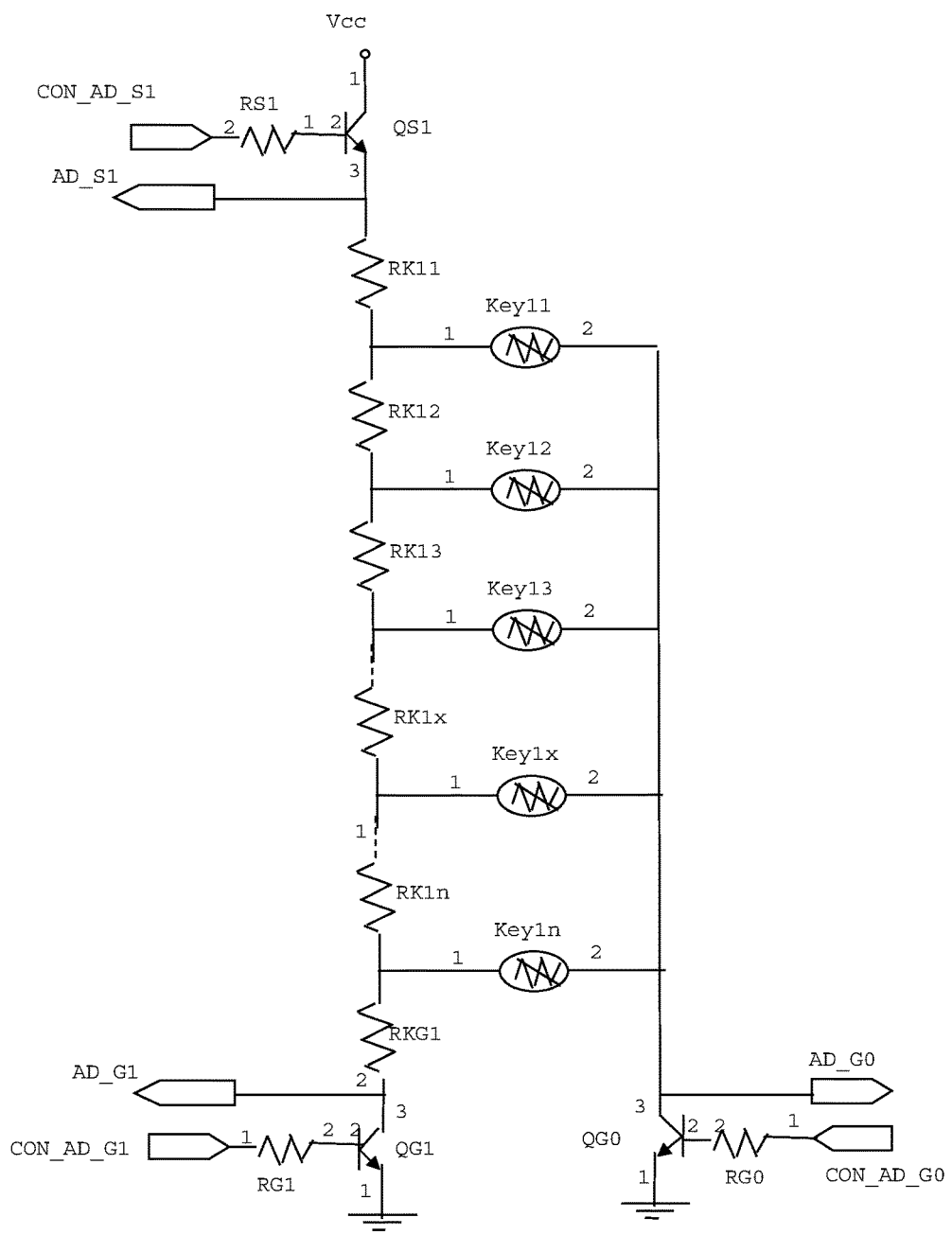
(FIG.3)

(FIG.4)
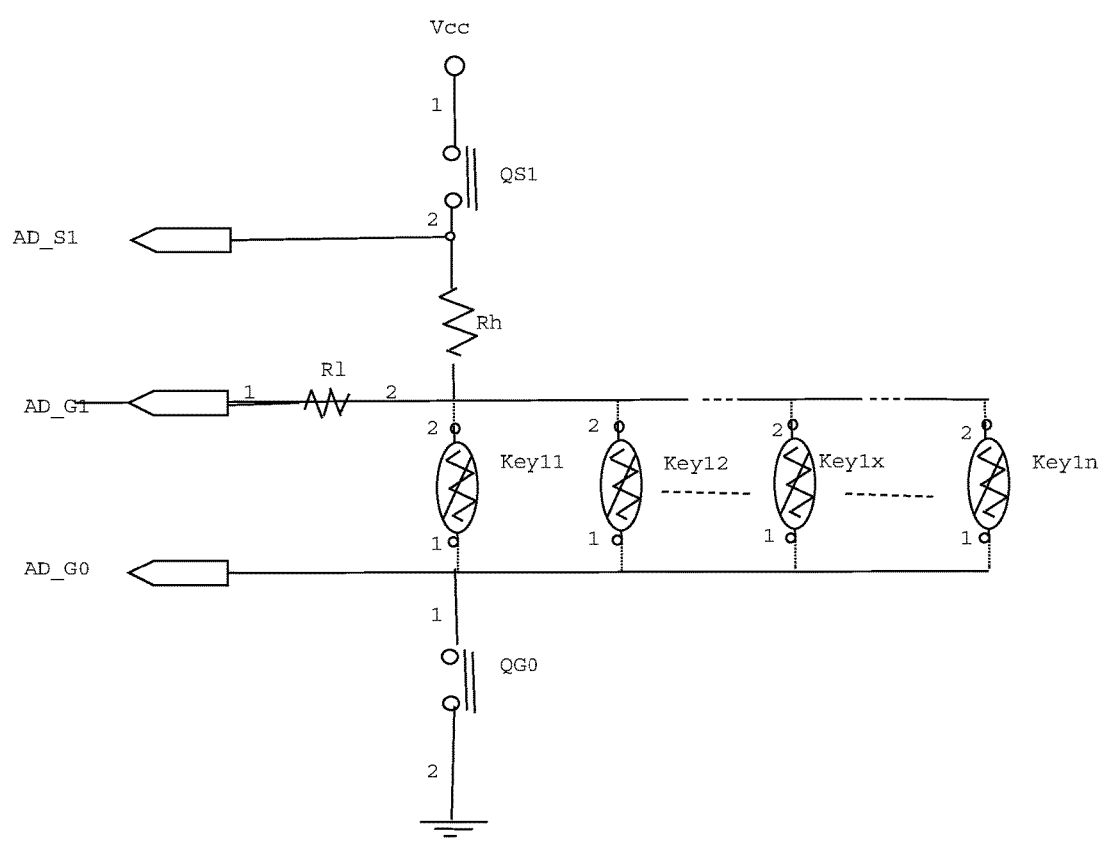

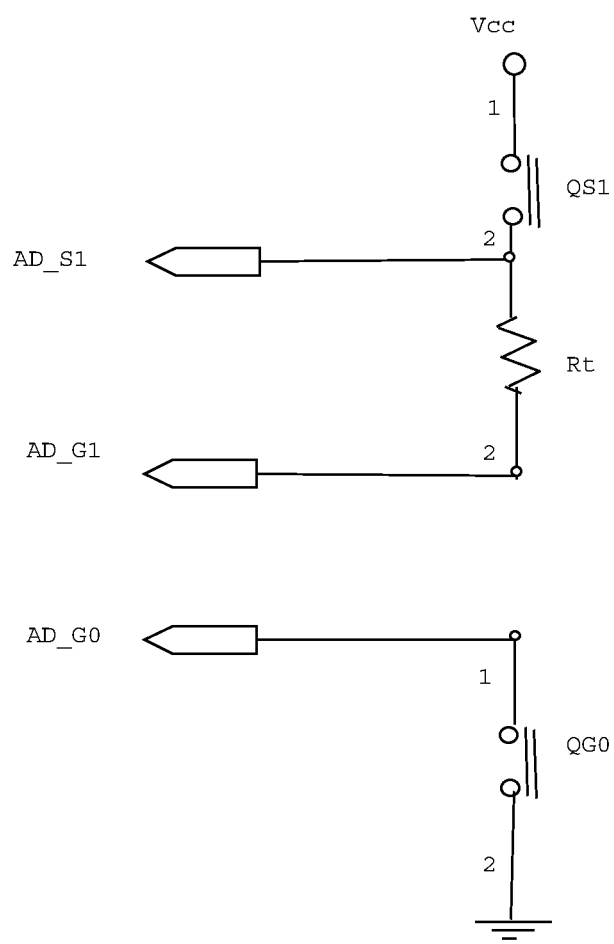
(FIG.5)

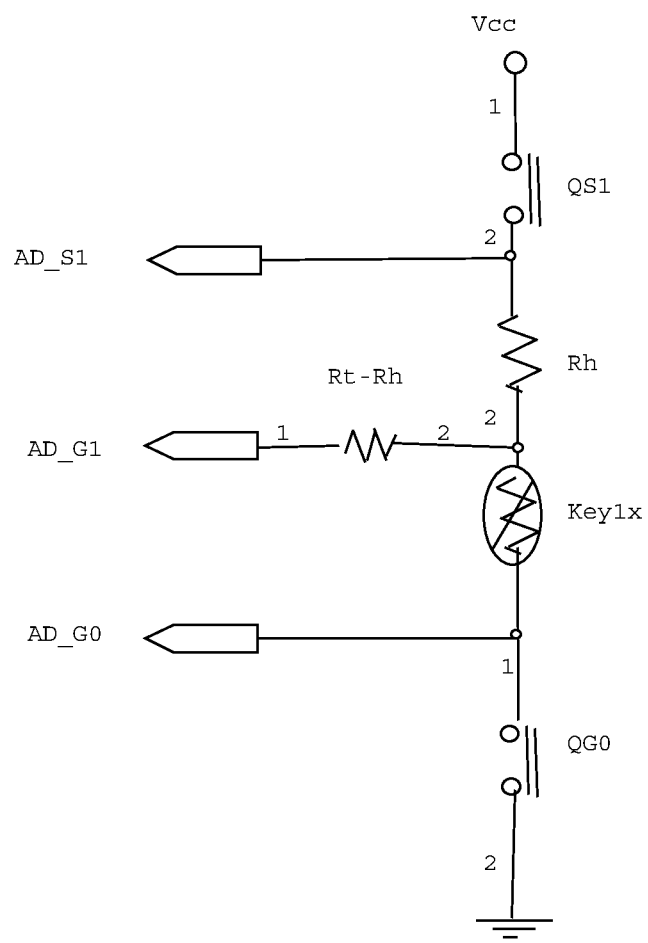
(FIG.6)

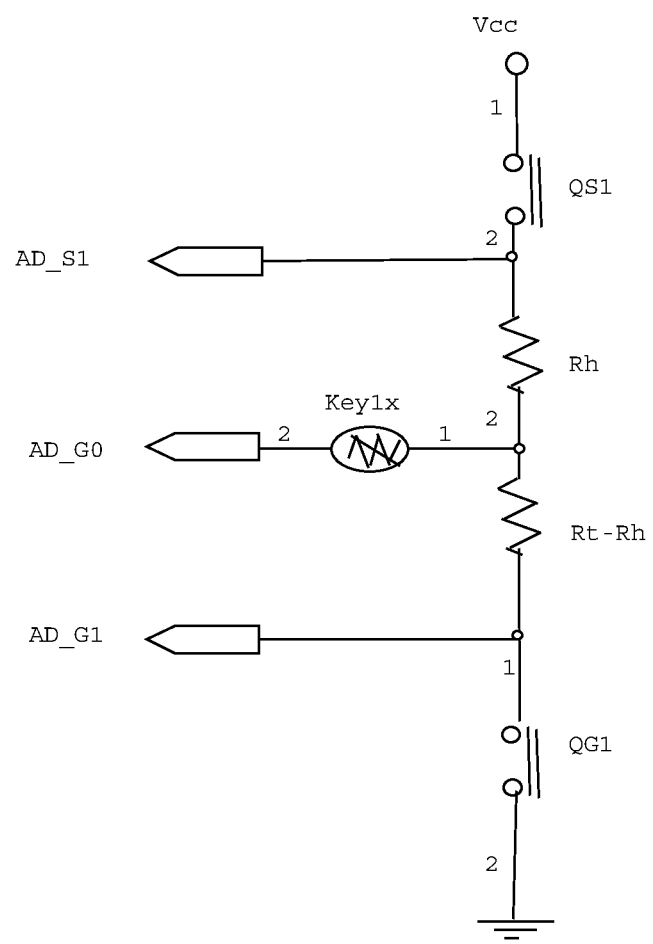
(FIG.7)

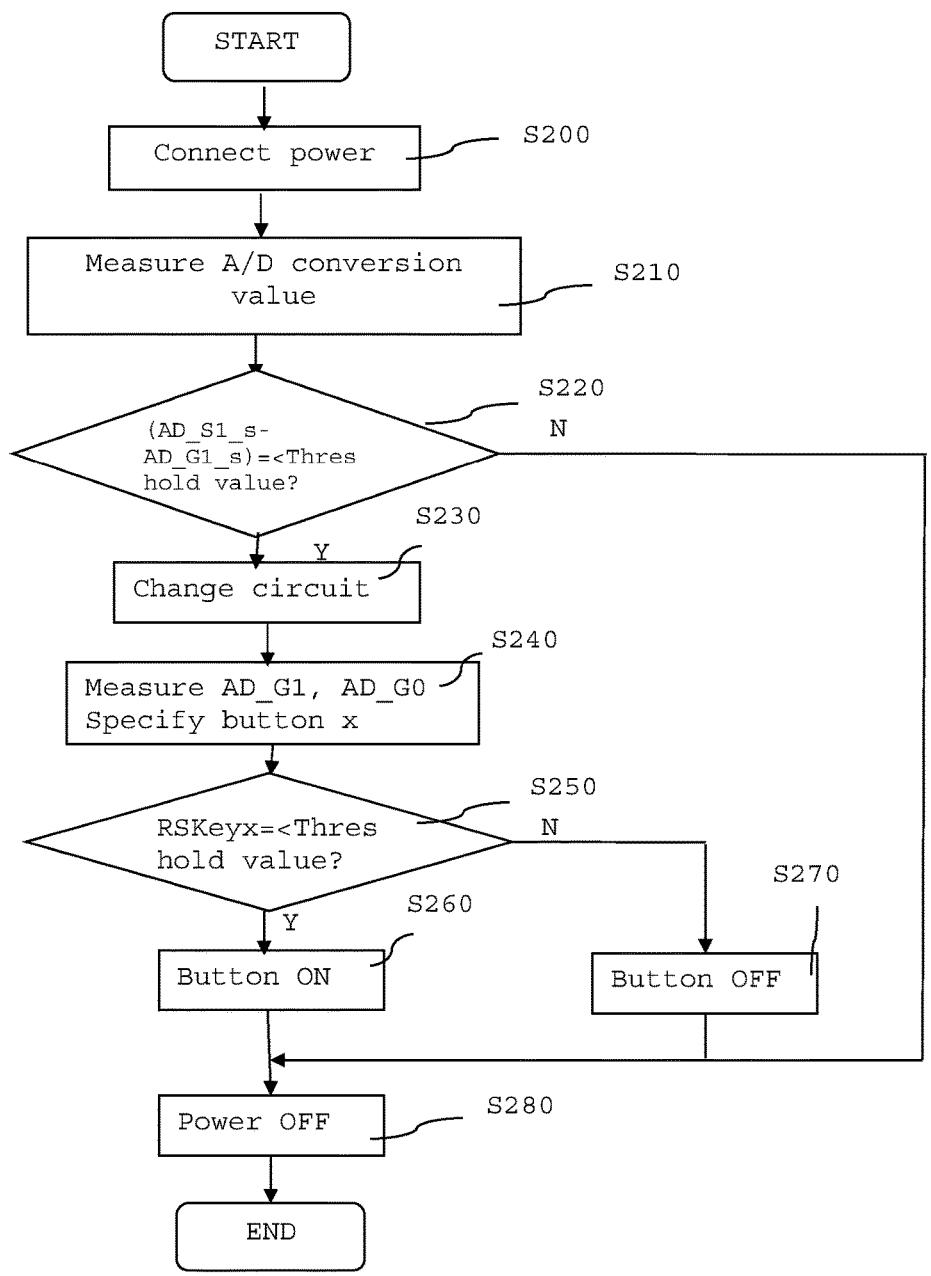
(FIG.8)

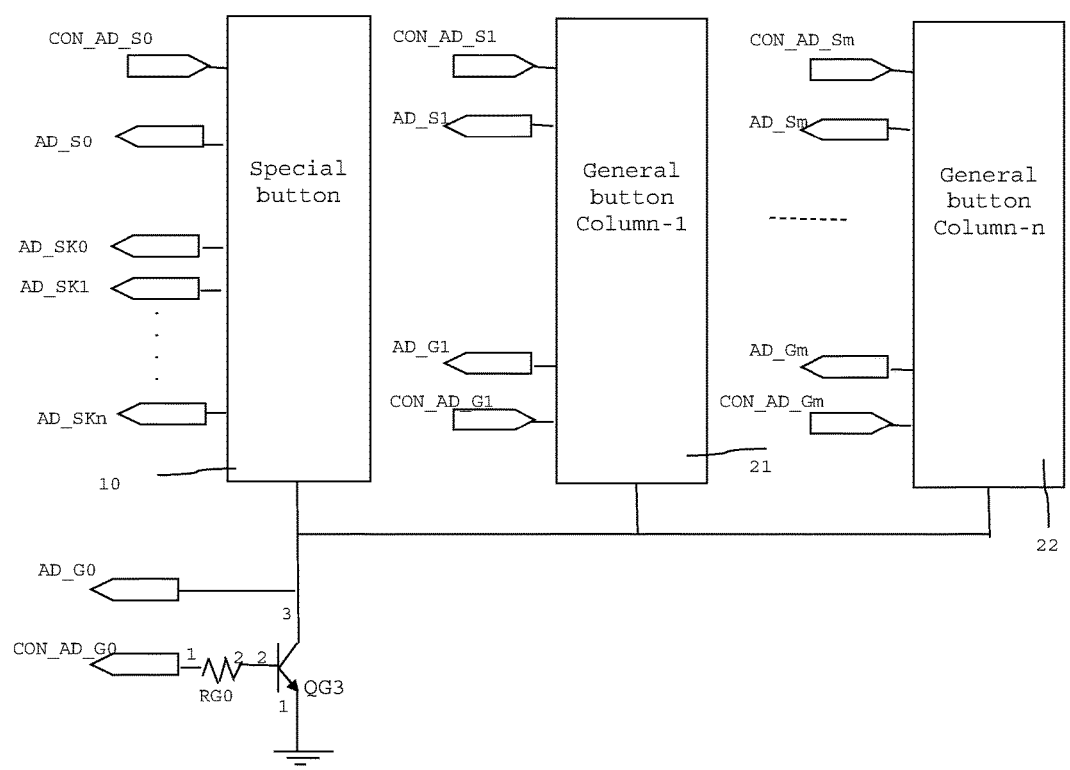
(FIG.9)

US 10,007,357 B2

METHOD FOR RECOGNIZING PRESS OF KEY ON KEYBOARD

RELATED APPLICATIONS

This application is a § 371 application from PCT/KR2016/005438 filed May 23, 2016, which claims priority from Korean Patent Application No. 10-2015-0115638 filed Aug. 17, 2015, each of which is incorporated herein by reference in its entirety.

TECHNICAL FIELD

The present invention relates to recognition of a press of a key of a keyboard, and more specifically, to a method of recognizing a press of a button of a keyboard that is as slim as to conveniently carry and capable of recognizing a press of a button although the button is easily pressed with a small force.

BACKGROUND ART

A keyboard is an input device which looks like a typewriter and is configured of Korean character keys, alphabetic keys, numeric keys, special character (non-character) keys and twelve function keys. Generally, the keyboard cannot be used standalone and may confirm, edit and modify input content in pair with an image display device (a monitor).

The operating principle of a keyboard is divided into an electronic type and a mechanical type according to the method of flowing electrical current. The electronic type is a method of grasping a pressed state of a key by measuring an amount of electric charges using a circuit connected under the key as the key is pressed. The mechanical type is a method of grasping a pressed state of a key by detecting whether electrical current flows as two metal plates under the key are attached or detached as the key is pressed.

A position of a key grasped from the keyboard is converted into a keyboard scan code through BIOS, recorded in a buffer, transmitted to a system and processed in the system.

Although the number of keys on a keyboard is 83 or 84 in the early stage, it has gradually increased to 101, 103 and 106 keys as the functions are expanded. A generally used keyboard is for Windows and has 106 keys in most cases. The keyboard is divided into a 2-set Korean keyboard, a 3-set Korean keyboard, an English QWERTY keyboard and an English Dvorak keyboard according to the form of arranging the keys.

The English QWERTY keyboard is a standard keyboard of the United States, which is named since the alphabetic characters in the first row below the numeric keys are arranged in order of Q, W, E, R, T and Y from the left.

The English Dvorak keyboard is a keyboard adopted as a second standard by the ANSI, in which frequently used keys are arranged at the center of the keyboard to improve input speed.

The keyboard has various non-character keys such as a Ctrl key, an Alt key, a Shift key, an Enter key, a Tab key and the like, in addition to the character keys. Since these non-character keys are used to change the original meaning of a key, to control operation of a program or to move text or a cursor on a monitor, they are referred to as special keys.

Smart devices such as smart phones, tablet PCs and the like are spotlighted recently, and although the smart devices adopt a text input method in the early stage using a touch screen, instead of a keypad, to show various information to a user, there is a problem of inputting an error by touching an adjacent key in the process of displaying a keyboard in a limited space and inputting text by the user by pressing keys one by one using a finger.

Particularly, the method of inputting text using a touch screen of a smart device invites inconvenience in using the smart device while doing a work in an office or the like, not in a state of moving with the smart phone.

Document of the Prior Art (Patent Document 0001) Korean Patent Registration No. 10-1113248 (registered on Jan. 31, 2012—Switching device for synchronization between computer and smart phone and inputting keyboard signal to the same)

OBJECT AND SUMMARY OF THE INVENTION

Technical Problem

Therefore, the present invention has been made in view of the above problems, and it is an object of the present invention to provide a method of recognizing a press of a button of a keyboard that is as slim as to conveniently carry and capable of recognizing a press of a button although the button is easily pressed with a small force and can be easily used in a smart phone, a tablet PC, a general PC or a notebook computer.

Technical Solution

To accomplish the above object, according to one aspect of the present invention, there is provided a method of recognizing a press of a button of a keyboard configured of a special button press processing unit 10 for processing a press of a plurality of special buttons, and a plurality of general button press processing units 21 and 22 for processing a press of a plurality of general buttons, wherein as many as a predetermined number of general buttons are configured in a block. The keyboard is as slim as to conveniently carry and includes a plurality of special key resistors $Skey0$ to $Skeyn$ and a plurality of general key resistors $Key11$ to $Key1n$, the resistance of which is proportional to a pressing pressure so as to recognize a press of a button although the button is pressed with a small force, and the method of recognizing a press of a button of a keyboard comprises the steps of: measuring A/D conversion values $AD\_S0$, $AD\_G0$ and $AD\_SK0$ to $AD\_SKn$ of an input side transistor, an output side transistor and special keys between the input side transistor and the output side transistor if transistors $QG0$ and $QS0$ supplying power for driving the special buttons are turned on, and determining a button press if a resistance value $RSKeyx$ of a certain special key $SKeys$ is smaller than a set threshold value; connecting power of the general buttons by turning off a transistor $QG1$ supplying power for driving the general buttons and turning on transistors $QG0$ and $QS1$ (step S200); measuring A/D conversion values of $AD\_S1$, $AD\_G1$ and $AD\_G0$, which are output values of the transistor $QG1$ and the transistors $QG0$ and $QS1$, and storing the measured values as $AD\_S1\_s$, $AD\_G1\_s$ and $AD\_G0\_s$ (step S210), determining whether a difference between the $AD\_S1\_s$ and the $AD\_G1\_s$ is smaller than a predetermined threshold value, and changing a circuit from a special button circuit to a general button circuit if the difference between the $AD\_S1\_s$ and the $AD\_G1\_s$ is smaller than the predetermined threshold value (step S230); specifying a press of a certain button x among the plurality of general buttons, turning on the button x by determining a press of the button x if a resistance value RSKey1x of the general button is smaller than a set threshold value when the certain button x is pressed (step S260), and turning off the button x since it is not a press of the button x if the resistance value RSKey1x of the general button is not smaller than the set threshold value (step S270); and turning off keyboard power if the transistors QG1, QG0 and QS1 are turned off (step S280).

Here, the special buttons include function key buttons such as a Shift key, an Alt key and a Ctrl Key.

In addition, an operation circuit of the special buttons is configured between the transistor QS0 on a power supply terminal side and the transistor QG0 on a ground side of the special buttons, wherein the circuit is configured to connect one side terminals 1 of first to n-th resistors RSK0 to RSKn, as many as the number of the special keys, to an output side of the input side transistor QS0 in parallel respectively, connect the other side terminals 2 of the first to n-th resistors RSK0 to RSKn to one side terminals 1 of special resistors SKey0 to SKeyn showing change of resistance proportional to a pressing pressure in series respectively, connect the other side terminals 2 of the special resistors SKey0 to SKeyn to an input side of the ground side transistor QG0, and output A/D conversion values AD_SK0 to AD_SKn of the resistors between the other side terminals 2 of the first to n-th resistors RSK0 to RSKn and the one side terminals 1 of the special resistors SKey0 to SKeyn.

Meanwhile, an operation circuit of the general buttons is configured between the transistor QS1 on a power supply terminal side of the general buttons and the transistor QG1 and the transistor QG0 respectively on a ground side of the general buttons and on a ground side of the special buttons, wherein first to n-th resistors RK11 to RK1n, as many as the number of set general keys, and a gate resistor RKG1 are connected in series between an output of the input side transistor QS1 and the ground side transistor QG1 of the general buttons, one side terminals 1 of special resistors Key11 to Key1n showing change of resistance proportional to a pressing pressure are connected in parallel respectively in between the first to n-th resistors RK11 to RK1n and the gate resistor RKG1, and the other side terminals 2 of the special resistors Key11 to Key1n are connected to an input side of the ground side transistor QG0 of the special buttons.

In addition, the step of determining a button press if a resistance value RSKeyx of a certain special key SKeys is smaller than a set threshold value is determined by RSkeyx=RSKn*(AD_SKn−AD_G0)/(AD_S0−AD_SKn).

Meanwhile, the method of recognizing a press of a special button includes the steps of: measuring, if power is connected to the plurality of special buttons (step S100), an A/D conversion value for recognizing which button is pressed among the plurality of special buttons (step S110), determining whether a resistance value RSKeyx of a certain special key SKeyx is smaller than a set threshold value according to a result of the measurement (step S120); recognizing a press of the corresponding special button if the resistance value is smaller than the set threshold value as a result of the determination, and determining it is not a button press if the resistance value is not smaller than the threshold value (step S130); and terminating the operation if power connection to the special button is turned off (step S140).

Here, the step of specifying the pressed button x includes the steps of: measuring an A/D conversion value AD_G1 on an input side of the transistor QG1 and an A/D conversion value AD_G0 of the transistor QG0 when the button x is pressed and storing the conversion values as AD_G1_x and AD_G0_x; obtaining, if a calculation value of the AD_G0_x is AD_G0_dx in a design of the circuit, the AD_G0_x from a formula of AD_G0_dx=((AD_S1_s−AD_G1_x)*(Rt−Rh)/Rt)+AD_G1_x; and comparing the AD_G0_dx and the AD_G0_x.

In addition, a formula for calculating the resistance value of the general button x is expressed as RSkey1x=Rh*(AD_G1_x−AD_G0_x)/(AD_S1_x−AD_G1_x).

Advantageous Effects

According to the present invention, there are effects shown below.

First, there is provided a keyboard as slim as to conveniently carry and capable of recognizing a press of a button although the button is easily pressed with a small force.

Second, since a keyboard input can be correctly recognized although the keyboard is implemented in a small size, particularly, convenience of smart phone or tablet PC users can be improved, and a keyboard that can be easily used in a general PC or a notebook computer can be provided.

BRIEF DESCRIPTION OF THE DRAWINGS

FIG. 1 is a circuit diagram showing a special button operation circuit in a method of recognizing a press of a button of a keyboard according to the present invention.

FIG. 2 is a flowchart illustrating a method of recognizing a press of a special button in a method of recognizing a press of a button of a keyboard according to the present invention.

FIG. 3 is a circuit diagram showing a general button operation circuit in a method of recognizing a press of a button of a keyboard according to the present invention.

FIG. 4 is an equivalent circuit diagram showing connection of a power in the case of a single column operation of a general key in a method of recognizing a press of a button of a keyboard according to the present invention.

FIG. 5 is an equivalent circuit diagram showing non-press of a key in the case of a single column operation of a general key in a method of recognizing a press of a button of a keyboard according to the present invention.

FIG. 6 is an equivalent circuit diagram showing a press of a certain key in the case of a single column operation of a general key in a method of recognizing a press of a button of a keyboard according to the present invention.

FIG. 7 is an equivalent circuit diagram showing determination of a press of a certain key in the case of a single column operation of a general key in a method of recognizing a press of a button of a keyboard according to the present invention.

FIG. 8 is a flowchart illustrating a method of single column operation of a general key in a method of recognizing a press of a button of a keyboard according to the present invention.

FIG. 9 is a view showing the configuration of the entire button circuit in a method of recognizing a press of a button of a keyboard according to the present invention.

DESCRIPTION OF SYMBOLS 21, 22: General button processing unit

DETAILED DESCRIPTION OF THE EMBODIMENTS

The preferred embodiments of the present invention will be hereafter described in detail with reference to the accompanying drawings.

In addition, although the terms used in the present invention are selected from general terms widely used in the present as long as possible, there are terms arbitrarily selected by the inventor in a specific case, and in this case, since their meanings are described in detail in the corresponding descriptions of the present invention, the present invention should be grasped in the meaning that the terms have, not the simple naming of the terms. In addition, in describing the present invention, details of the techniques well-known in the art and not directly related to the present invention will be omitted. It is to further clearly deliver, not to obscure, the gist of the present invention by omitting unnecessary descriptions.

FIG. 1 is a circuit diagram showing a special button operation circuit in a method of recognizing a press of a button of a keyboard according to the present invention.

In a method of recognizing a press of a button of a keyboard according to the present invention, a special button operation circuit is as shown in FIG. 1, and here, special buttons include function key buttons such as a Shift key, an Alt key and a Ctrl key.

The special button operation circuit is configured between a transistor QS0 on the power supply terminal side and a transistor QG0 on the ground side of the special buttons as shown in FIG. 1, and at this point, one side terminals 1 of first to n-th resistors RSK0 to RSKn, as many as the number of special keys, are respectively connected to the output side of the input side transistor QS0 in parallel, the other side terminals 2 of the first to n-th resistors RSK0 to RSKn are respectively connected to one side terminals 1 of special resistors SKey0 to SKeyn showing change of resistance proportional to a pressing pressure in series, and the other side terminals 2 of the special resistors SKey0 to SKeyn are connected to the input side of the ground side transistor QG0. In addition, the circuit is configured to output A/D conversion values AD_SK0 to AD_SKn of the resistors between the other side terminals 2 of the first to n-th resistors RSK0 to RSKn and the one side terminals 1 of the special resistors SKey0 to SKeyn.

First, if the transistors QG0 and QS0 supplying power for driving the special buttons are turned on, A/D conversion values of AD_S0, AD_G0 and AD_SK0 to AD_SKn are measured, and if the resistance value RSkeyx of a certain special key SKeyx is smaller than a set threshold value, it is determined as a press of the button.

This can be expressed as shown in Mathematical expression 1.

$$RSkeyx = RSKn \cdot (AD\_SKn - AD\_G0)/(AD\_S0 - AD\_SKn)$$ [Mathematical expression 1]

Next, if the transistors QG0 and QS0 supplying power for finishing the special buttons are turned off, the press of the special button is not recognized. At this point, a user may select a working pressure. Of course, this may be determined through experiences in the field or by experiments, and for example, if the pressure is set to sense a pressure of 0.1 to 100 g or smaller, a button press can be sensed with a small power.

The entire button circuit in the method of recognizing a press of a button of a keyboard according to the present invention is configured of special buttons 10 and a plurality of general buttons 20 and 30 as shown in FIG. 1, and here, the special buttons include a Shift key, an Alt key, a Ctrl Key and the like, and the general buttons are alphabetic and numeric keys.

FIG. 2 is a flowchart illustrating a method of recognizing a press of a special button in a method of recognizing a press of a button of a keyboard according to the present invention.

As shown in FIG. 2, in the method of recognizing a press of a special button in a method of recognizing a press of a button of a keyboard according to the present invention, if power is connected to the plurality of special buttons (step S100), an A/D conversion value for recognizing which button is pressed among the plurality of special buttons is measured (step S110).

It is determined whether a resistance value RSKeyx of a certain special key SKeyx is smaller than a set threshold value according to a result of the measurement (step S120).

If the resistance value is smaller than the set threshold value as a result of the determination, a press of the corresponding special button is recognized, and if the resistance value is not smaller than the threshold value, it is determined as not a button press (step S130).

Then, if power connection to the special button is turned off, the operation is terminated (step S140).

FIG. 3 is a circuit diagram showing a general button operation circuit in a method of recognizing a press of a button of a keyboard according to the present invention, FIG. 4 is an equivalent circuit diagram showing connection of a power in the case of a single column operation of a general key in a method of recognizing a press of a button of a keyboard according to the present invention, FIG. 5 is an equivalent circuit diagram showing non-press of a key in the case of a single column operation of a general key in a method of recognizing a press of a button of a keyboard according to the present invention, FIG. 6 is an equivalent circuit diagram showing a press of a certain key in the case of a single column operation of a general key in a method of recognizing a press of a button of a keyboard according to the present invention, FIG. 7 is an equivalent circuit diagram showing determination of a press of a certain key in the case of a single column operation of a general key in a method of recognizing a press of a button of a keyboard according to the present invention, FIG. 8 is a flowchart illustrating a method of single column operation of a general key in a method of recognizing a press of a button of a keyboard according to the present invention, and FIG. 9 is a view showing the configuration of the entire button circuit in a method of recognizing a press of a button of a keyboard according to the present invention.

A circuit for describing the operation of the general buttons in the method of recognizing a press of a button of a keyboard according to the present invention is as shown in FIGS. 3 to 8. First, as shown in FIG. 3, a general button circuit is configured between a transistor QS1 on the power supply terminal side of the general buttons and a transistor QG1 and the transistor QG0 respectively on the ground side of the general buttons and on the ground side of the special buttons, and at this point, first to n-th resistors RK11 to RK1n, as many as the number of set general keys, and a gate resistor RKG1 are connected in series between the output of the input side transistor QS1 and the ground side transistor QG1 of the general buttons. In addition, one side terminals 1 of special resistors Key11 to Key1n showing change of resistance proportional to a pressing pressure are connected in parallel respectively in between the first to n-th resistors RK11 to RK1n and the gate resistor RKG1, and the other side terminals 2 of the special resistors Key11 to Key1n are connected to the input side of the ground side transistor QG0 of the special buttons.

At this point, as shown in FIG. 3, the general button circuit (a single column) and the special button circuit commonly use AD_G0, CON_AD_G0, RG0 and QG0. At this point, ten buttons may be set in a block of the general button circuit (refer to FIG. 9 and corresponding descriptions).

In a single column operation, power of general buttons is connected by turning off the transistor QG1 and turning on the transistors QG0 and QS1 as shown in FIG. 4 (step S200).

In this state, A/D conversion values of AD_S1, AD_G1 and AD_G0 are measured, and the measured values are stored as AD_S1_s, AD_G1_s and AD_G0_s (step S210).

Next, it is determined whether the difference between AD_S1_s and AD_G1_s is smaller than a predetermined threshold value (step S220). At this point, a non-press equivalent circuit is as shown in FIG. 5, and a non-press resistance value is obtained as Rt=RK11+RK12+~+RK1$n$+RKG1, and a key press Key1$x$ is as shown in FIG. 6, and a key press resistance value can be obtained as Rh=RK11+RK12+~+RK1$x$.

If the difference between AD_S1_s and AD_G1_s is smaller than a predetermined threshold value as a result of the determination (step S220), the circuit is changed from a special button circuit to a general button circuit (step S230). The equivalent circuit according thereto is as shown in FIG. 7.

Subsequently, a press of a certain button x among a plurality of general buttons is measured (step S240). At this point, an A/D conversion value of the AD_G1 and an A/D conversion value of the AD_G0 when the button x is pressed are measured and stored as AD_G1_x and AD_G0_x. Meanwhile, if a calculation value of the AD_G0_x is AD_G0_dx in the design of the circuit, the AD_G0_dx can be obtained from a formula of AD_G0_dx=((AD_S1_x−AD_G1_x)·(Rt−Rh)/Rt)+AD_G1_x.

Then, a pressed button x is specified by comparing the AD_G0_dx and the AD_G0_x. At this point, if the resistance value RSkey1$x$ of a general button is smaller than a set threshold value when button x is pressed, it is determined as a press of button x (step S250). Here, a formula for calculating the resistance value of the general button x can be expressed as shown in mathematical expression 2.

$$RSkey1x = Rh \cdot (AD\_G1\_x - AD\_G0\_x)/(AD\_S1\_x - AD\_G1\_x)$$ [Mathematical expression 2]

Particularly, although only information on ON/OFF of a contact point can be grasped in an existing keyboard, in the present invention, since a resistance value RSkey1$x$ corresponding to a keyboard pressing pressure can be additionally provided, this can be applied to development of computer S/W.

If the resistance value RSkey1$x$ is smaller than the threshold value as a result of the determination (step S250), the button is turned on since it is a press of button x, and if the resistance value RSkey1$x$ is not smaller than the threshold value, the button is turned off since it is not a press of button x.

Meanwhile, if transistors QG1, QG0 and QS1 are turned off, the keyboard power is turned off (step S280).

As shown in FIG. 9, the present invention as described above relates to a method of recognizing a press of a button of a keyboard by a separate equation proportional to a pressing pressure in a keyboard configured of a special button press processing unit 10 for processing a press of a plurality of special buttons, and a plurality of general button press processing units 21 and 22 for processing a press of a plurality of general buttons, in which as many as a predetermined number of general buttons are configured in a block, and the keyboard is as slim as to conveniently carry and includes resistors proportional to a pressing pressure, such as a plurality of special key resistors Skey0 to Skey$n$ as shown in FIG. 1 and a plurality of general key resistors Key11 to Key1$n$ as shown in FIG. 3, to recognize a press of a button although the button is pressed with a small force.

While the present invention has been described with reference to the embodiments, the present invention is not necessarily limited to the embodiments but may be diversely modified without departing from the spirit of the present invention. Therefore, the embodiments disclosed in the present invention are not to restrict but to describe the spirit of the present invention, and the scope of the spirit of the present invention is not limited by embodiments. The scope of the present invention should be interpreted by the following claims, and all the technical spirits within the equivalent scope should be interpreted as being included in the scope of the present invention.

INDUSTRIAL APPLICABILITY

The present invention relates to a method of recognizing a press of a button of a keyboard, in which the keyboard includes a special button press processing unit for processing a press of a plurality of special buttons, and a plurality of general button press processing units for processing a press of a plurality of general buttons, in which as many as a predetermined number of general buttons are configured in a block. The keyboard is as slim as to conveniently carry and includes a plurality of special key resistors (Skey0 to Skey$n$) and a plurality of general key resistors (Key11 to Key1$n$), the resistance of which is proportional to a pressing pressure so as to recognize a press of a button although the button is pressed with a small force. Since the keyboard is as slim as to conveniently carry and capable of recognizing a press of a button although the button is easily pressed with a small force, can be easily used in a smart phone, a tablet PC, a general PC or a notebook computer, and, particularly, may additionally provide a resistance value RSKey1$x$ corresponding to a keyboard pressing pressure, the present invention can be applied to development of computer S/W.

The invention claimed is:

1. A method of recognizing a press of a button of a keyboard comprising a special button press processing unit to process a press of a plurality of special key buttons, and a plurality of general button press processing units to process of a plurality of general key buttons, wherein a predetermined number of general key buttons are configured in a block, the keyboard is portable and further comprises a plurality of special key resistors SKey$_0$-SKey$_n$ and a plurality of general key resistors Key1$_1$-Key1$_n$, a resistance of each of the special key resistors SKey$_0$-SKey$_n$ and the general key resistors is proportional to a pressing pressure to recognize a press of a button, the method comprising steps of:

measuring an A/D conversion value AD_S0 of a first input side transistor, an A/D conversion value AD_G0 of a first output side transistor and A/D conversion values AD_SK$_0$-AD_SK$_n$ of special key buttons between the input side transistor and the output side transistor in response to the first input side transistor and the first output side transistor being turned on to supply power to drive the special key buttons, and determining a button press in response to a determination that a resistance value RSKey$_x$ of a special key SKey$_x$ is smaller than a set threshold value;

connecting power of the general key buttons by turning off a second output side transistor supplying power to drive the general key buttons, turning on the first output side transistor and a second input side transistor, and measuring an A/D conversion value AD_G1 of an output value of the second output side transistor, the AD conversion value AD_G0 of an output value of the first output side transistor and an AD conversion value AD_S1 of an output value the second input side transistor, and storing the measured values AD_G1, AD_G0 and AD_S1;

determining whether a difference between the output value AD_S1 of the second input side transistor and the output value AD_G1 of the second output side transistor is smaller than a predetermined threshold value, and changing from a special button operation circuit to a general button operation circuit in response to a determination that the difference between the output value AD_S1 of the second input side transistor and the output value AD_G1 of the second output side transistor is smaller than the predetermined threshold value;

specifying a press of a general $key_x$ button among the plurality of general key buttons, turning on the general $key_x$ button by determining a press of the general $key_x$ button in response to a determination that a resistance value $RSKey1_x$ of the general $key_x$ button is smaller than the set threshold value, and turning off the general $key_x$ button in response to the determination that the resistance value $RSKey1_x$ of the general $key_x$ button is not smaller than the set threshold value; and turning off keyboard power in response to a determination that the second output side transistor, the first output side transistor and the second input side transistor are turned off.

2. The method according to claim 1, wherein the special key buttons comprise function key buttons of the keyboard, the function key buttons comprising at least a shift key button, an alt key button and a ctrl key button.

3. The method according to claim 1, wherein the special button operation circuit of the special key buttons is configured between the first input side transistor on a power supply terminal side and the first output side transistor on a ground side of the special key buttons, wherein the special button operation circuit is configured to:

connect first side terminals of a first set of resistors $RSK_0$-$RSK_n$ to an output side of the first input side transistor in parallel respectively, a number of the first set of resistors corresponding to a number of special key buttons;

connect second side terminals of the first set of resistors $RSK_0$-$RSK_n$ to first side terminals of the special key resistors $SKey_0$-$SKey_n$ showing a change of resistance proportional to the pressing pressure in series respectively;

connect second side terminals of the special key resistors $SKey_0$-$SKey_n$ to an input side of the first output side transistor; and output the A/D conversion values of the resistance value of the special keys between the second side terminals of the first set of resistors $RSK_0$-$RSK_n$ and the first side terminals of the special key resistors $SKey_0$-$SKey_n$.

4. The method according to claim 1, wherein the general button operation circuit of the general key buttons is configured between the second input side transistor on a power supply terminal side of the general key buttons and the second output side transistor and the first output side transistor respectively on a ground side of the general key buttons and on a ground side of the special key buttons; wherein the general button operation circuit is configured to:

connect a second set of resistors and a gate resistor in series between an output of the second input side transistor and an input of the second output side transistor of the general key buttons, a number of the second set of resistors corresponding to a number of the general key buttons;

connect first side terminals of the general key resistors $Key1_1$-$Key1_n$ showing a change of resistance proportional to the pressing pressure in parallel respectively in between the second set of resistors and the gate resistor; and connect second side terminals of the general key resistors $Key1_1$-$Key1_n$ to an input of the first output side transistor of the special key buttons.

5. The method according to claim 3, wherein the step of determining the button press in response to the determination that the resistance value $RSKey_x$ of the special key $SKey_x$ is smaller than the set threshold value is determined from $RSKey_x=RSK_n*(AD\_SK_n-AD\_G0)/(AD\_S0-AD\_SK_n)$.

6. The method according to claim 1, further comprising steps of:

measuring an A/D conversion value to recognize which button is pressed among the plurality of special key buttons in response to a determination that a power is connected to the plurality of special key buttons;

determining whether the resistance value $RSKey_x$ of the special key $SKey_x$ is smaller than the set threshold value according to a result of the measurement;

recognizing a press of a special key button corresponding to the special key $SKey_x$ in response to the determination that the resistance value $RSKey_x$ of the special key $SKey_x$ is smaller than the set threshold value, and determining non-press of the special key button corresponding to the special key $SKey_x$ in response to the determination that the resistance value $RSKey_x$ of the special key $SKey_x$ is not smaller than the set threshold value; and terminating an operation to recognize the press of the special key button $SKey_x$ in response to a determination that a power connection to the special key button $SKey_x$ is turned off.

7. The method according to claim 1, wherein the step of specifying the press of the general key button comprises steps of:

measuring the A/D conversion value AD_G1 of the second output side transistor, the A/D conversion value AD_S1 of the second input side transistor and the A/D conversion value AD_G0 of the first output side transistor in response to the press of the general key button and storing the measured A/D conversion values as AD_G1_x, AD_S1_x and AD_G0_x, respectively;

determining a calculated A/D value AD_G0_dx of the first output side transistor for the press of the general $key_x$ from $AD\_G0\_dx=((AD\_S1\_x-AD\_G1\_x)*(Rt-Rh)/Rt)+AD\_G1\_x$, where Rt is a non-press resistance value and Rh is a key press resistance value; and comparing the calculated A/D conversion value AD_G0_dx to the measured A/D conversion value AD_G0_x.

8. The method according to claim 7, further comprising a step of calculating the resistance value $RSKey1_x$ of the general key button from $RSKey1_x=Rh\times(AD\_G1\_x-AD\_G0\_x)/(AD\_S1\_x-AD\_G1\_x)$.

* * * * *